US010546621B2

(12) United States Patent
Murduck et al.

(10) Patent No.: US 10,546,621 B2
(45) Date of Patent: Jan. 28, 2020

(54) MAGNETIC JOSEPHSON JUNCTION DRIVEN FLUX-BIASED SUPERCONDUCTOR MEMORY CELL AND METHODS

(71) Applicant: Microsoft Technology Licensing, LLC, Redmond, WA (US)

(72) Inventors: James M. Murduck, Ellicott City, MD (US); Thomas F. Ambrose, Crownsville, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 5 days.

(21) Appl. No.: 16/013,549

(22) Filed: Jun. 20, 2018

(65) Prior Publication Data

US 2019/0392878 A1    Dec. 26, 2019

(51) Int. Cl.
| | |
|---|---|
| *G11C 11/00* | (2006.01) |
| *G11C 11/16* | (2006.01) |
| *H01L 39/02* | (2006.01) |
| *G11C 11/44* | (2006.01) |
| *H01L 39/22* | (2006.01) |

(52) U.S. Cl.
CPC ........ *G11C 11/161* (2013.01); *G11C 11/1673* (2013.01); *G11C 11/44* (2013.01); *H01L 39/025* (2013.01); *H01L 39/223* (2013.01)

(58) Field of Classification Search
CPC ... G11C 11/161; G11C 11/1673; G11C 11/44; H01L 39/025; H01L 39/223
See application file for complete search history.

(56) References Cited

U.S. PATENT DOCUMENTS

| | | |
|---|---|---|
| 4,224,630 A | 9/1980 | Kroger |
| 5,388,068 A | 2/1995 | Ghoshal et al. |
| 5,640,343 A | 6/1997 | Gallagher et al. |

(Continued)

FOREIGN PATENT DOCUMENTS

WO    2013180946 A1    12/2013

OTHER PUBLICATIONS

Chen, Lei, et al., "A high performance NB nano-SQUID with a three-dimensional structure," Nano Letters, 2016, 23 pages.

(Continued)

*Primary Examiner* — Toan K Le
(74) *Attorney, Agent, or Firm* — Ranjeev Singh; Singh Law, PLLC

(57) ABSTRACT

Magnetic Josephson junction driven flux-biased superconductor memory cell and methods are provided. A memory cell may include a magnetic Josephson junction (MJJ) superconducting quantum interference device (SQUID) comprising a first MJJ device and a second MJJ device, arranged in parallel to each other, where the MJJ SQUID is configured to generate a first flux-bias or a second flux-bias, where the first flux-bias corresponds to a first direction of current flow in the MJJ SQUID and the second flux-bias corresponds to a second direction of current flow in the MJJ SQUID. The memory cell may further include a superconducting metal-based superconducting quantum interference device (SQUID) including a first Josephson junction (JJ) and a second JJ, arranged in parallel to each other, where each of the first JJ and the second JJ has a critical current responsive to any flux-bias generated by the MJJ SQUID.

20 Claims, 5 Drawing Sheets

(56) References Cited

U.S. PATENT DOCUMENTS

| | | | |
|---|---|---|---|
| 7,486,550 B2 | 2/2009 | Banerjee et al. | |
| 8,208,288 B2 | 6/2012 | Bulzacchelli et al. | |
| 8,270,209 B2* | 9/2012 | Herr | G11C 11/44 |
| | | | 365/162 |
| 9,013,916 B2* | 4/2015 | Naaman | G11C 11/44 |
| | | | 365/162 |
| 9,281,057 B1 | 3/2016 | Herr et al. | |
| 9,443,576 B1* | 9/2016 | Miller | G11C 11/44 |
| 9,460,397 B2 | 10/2016 | Apalkov et al. | |
| 9,472,256 B1 | 10/2016 | Andre | |
| 9,520,181 B1* | 12/2016 | Miller | G11C 11/44 |
| 9,972,380 B2 | 5/2018 | Ambrose | |
| 10,204,677 B1* | 2/2019 | Luo | G11C 11/44 |
| 2015/0094207 A1 | 4/2015 | Herr et al. | |
| 2016/0012882 A1 | 1/2016 | Bleloch | |
| 2016/0267964 A1* | 9/2016 | Herr | G11C 11/44 |
| 2019/0164077 A1* | 5/2019 | Roberts | G01R 33/035 |
| 2019/0196973 A1* | 6/2019 | Horner | G06N 10/00 |

OTHER PUBLICATIONS

Dayton, Ian M., "Experimental Demonstration of a Josephson Magnetic Memory Cell with a Programmable π-Junction," IEEE Magnetics Letters 9(1), 3301905, 2018, 5 Pages.

Gingrich, E.C., "Controllable 0-πJosephson junctions containing a ferromagnetic spin valve," Letters: Nature Physics, pp. 654-569, Mar. 14, 2016.

Gokemeijer, N. J., "Long-Range Exchange Bias across a Spacer Layer," Physical Review Letters, vol. 79, No. 21, pp. 4270-4273, Nov. 24, 1997.

"International Search Report and Written Opinion Issued in PCT Application No. PCT/US2019/036438", dated Sep. 17, 2019, 12 Pages.

Vernik, et al., "Magnetic Josephson Junctions With Superconducting Interlayer for Cryogenic Memory", In Proceedings of the IEEE Transactions on Applied Superconductivity, vol. 23, Issue 3, Dec. 10, 2012, 8 Pages.

* cited by examiner

MAGNETIC JOSEPHSON JUNCTION DRIVEN FLUX-BIASED SUPERCONDUCTOR MEMORY CELL AND METHODS

BACKGROUND

Semiconductor based integrated circuits used in electronic devices, such as random access memories, include digital circuits based on complimentary metal-oxide semiconductor (CMOS) technology. CMOS technology, however, is reaching its limits in terms of the device size. In addition, leakage current in CMOS based memories is causing high power consumption even when these memories are not being accessed.

As an example, servers in a data center are increasingly consuming large amounts of power. The consumption of power is partly the result of power loss from the dissipation of energy even when the CMOS circuits are inactive. This is because even when such circuits, such as random access memories, are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing operations, such as read/write, a certain amount of power is wasted not only as a result of the requirement to maintain the state of the CMOS transistors, but also as a result of the current leakage.

An alternative approach to CMOS technology based memory is a superconducting logic based memory.

SUMMARY

In one example, the present disclosure relates to a memory cell including a magnetic Josephson junction (MJJ) superconducting quantum interference device (SQUID) comprising a first MJJ device and a second MJJ device, arranged in parallel to each other, where the MJJ SQUID is configured to generate a first flux-bias or a second flux-bias, where the first flux-bias corresponds to a first direction of current flow in the MJJ SQUID and the second flux-bias corresponds to a second direction of current flow in the MJJ SQUID, where the first direction is opposite to the second direction. The memory cell may further include a superconducting metal-based superconducting quantum interference device (SQUID) including a first Josephson junction (JJ) and a second JJ, arranged in parallel to each other, where each of the first JJ and the second JJ has a critical current responsive to any flux-bias generated by the MJJ SQUID, and where, in response to a read operation, the superconducting metal-based SQUID is configured to provide an output based at least on the first flux-bias or the second flux-bias.

In another aspect, the present disclosure relates to a method in a memory cell including a magnetic Josephson junction (MJJ) superconducting quantum interference device (SQUID) comprising a first MJJ device and a second MJJ device, arranged in parallel to each other, and a superconducting metal-based superconducting quantum interference device (SQUID) including a first Josephson junction (JJ) and a second JJ, arranged in parallel to each other. The method may include generating a first flux-bias or a second flux-bias, where the first flux-bias corresponds to a first direction of current flow in the MJJ SQUID and the second flux-bias corresponds to a second direction of current flow in the MJJ SQUID, where the first direction is opposite to the second direction. The method may further include in response to a read operation, responsive to any flux-bias generated by the MJJ SQUID, the superconducting metal-based SQUID providing an output based at least on the first flux-bias or the second flux-bias.

In yet another aspect, the present disclosure relates to a memory system including an array of memory cells arranged in rows and columns, a set of read word-lines coupled to the array of the memory cells, and a set of read bit-lines coupled to the array of memory cells. Each of the memory cells may include a magnetic Josephson junction (MJJ) superconducting quantum interference device (SQUID) comprising a first MJJ device and a second MJJ device, arranged in parallel to each other, where the MJJ SQUID is configured to generate a first flux-bias or a second flux-bias, where the first flux-bias corresponds to a first direction of current flow in the MJJ SQUID and the second flux-bias corresponds to a second direction of current flow in the MJJ SQUID, where the first direction is opposite to the second direction. Each of the memory cells may further include a superconducting metal-based superconducting quantum interference device (SQUID) including a first Josephson junction (JJ) and a second JJ, arranged in parallel to each other, where each of the first JJ and the second JJ has a critical current responsive to any flux-bias generated by the MJJ SQUID, and where, in response to a read operation initiated via at least one of set of the read word-lines and at least one of the set of the read-bit lines, the superconducting metal-based SQUID is configured to provide an output based at least on the first flux-bias or the second flux-bias.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
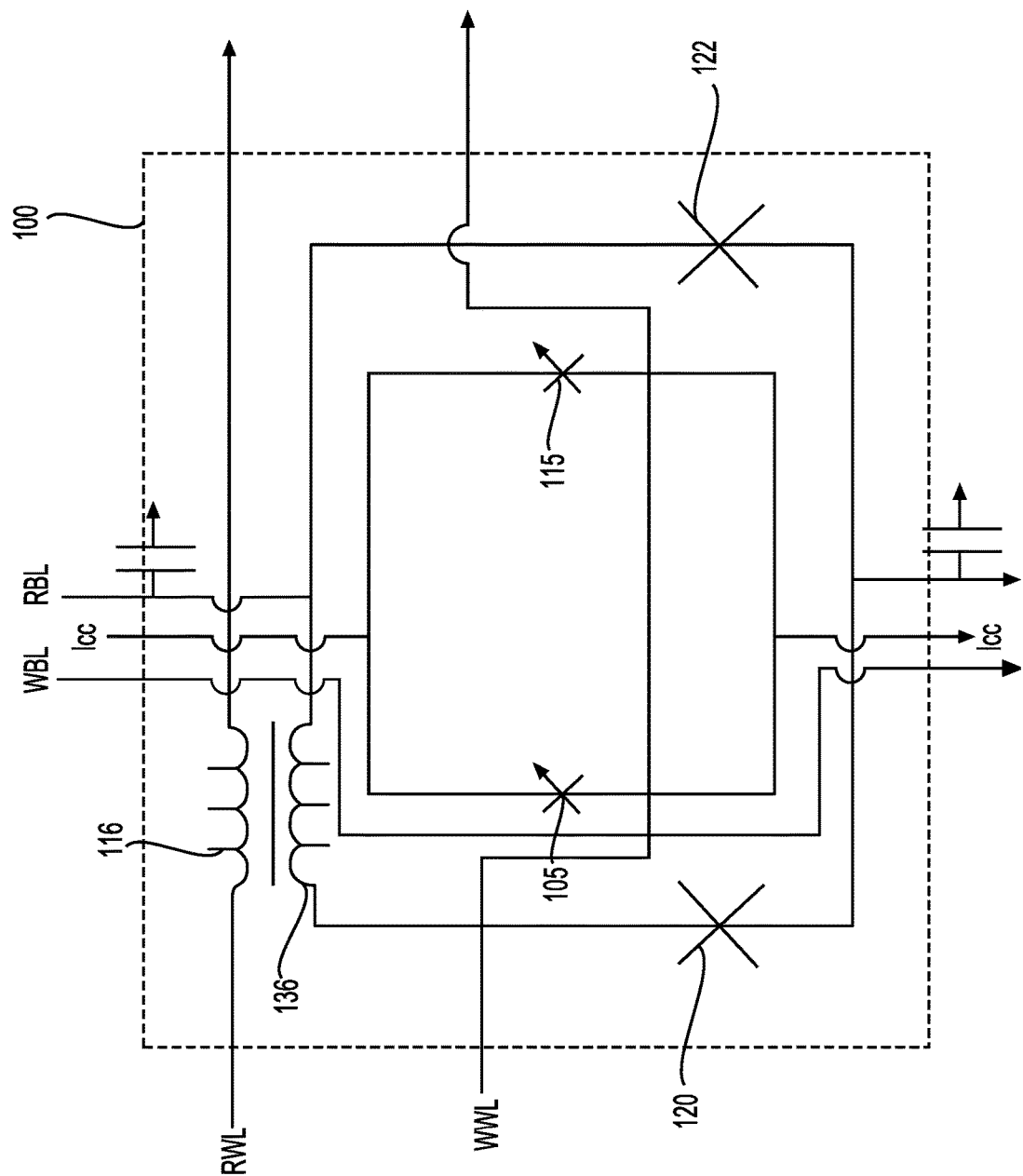
FIG. 1 shows a diagram of a memory cell in accordance with one example.

Examples described in this disclosure relate to superconducting logic-based memory systems, including superconductor memory cells. Certain examples relate to magnetic Josephson junction (MJJ)-driven flux-biased memory cells. The memory cells may be implemented using any single flux quantum (SFQ) compatible logic. One example of such logic is the reciprocal quantum logic (RQL). Thus, certain examples further relate to reciprocal quantum logic (RQL) compatible memory cells. Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Superconductors, such as niobium, have a critical temperature (Tc) below which they have zero resistance. Niobium, one such superconductor, has a critical temperature (Tc) of 9.3 Kelvin degrees. At temperatures below Tc, Niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type of junctions, the superconducting electrons are described by a quantum mechanical wave-function. A changing phase difference in time of the phase of the superconducting electron wave-function between the two superconductors corresponds to a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B (AanB) gate, and a logical AND & OR (AndOr) gate. The AanB gate may have two inputs and one output (Q). An input pulse A may propagate to output Q unless an input pulse B comes first. The AndOr gate may have two inputs and two outputs (Q1 and Q2). The first input pulse, input pulse A or input pulse B, goes to output Q1 and the second input pulse goes to output Q2. The logical behavior of these gates may be based on the reciprocal data encoding mentioned earlier. As an example, a positive pulse changes the internal flux state of the inductive loop, but the trailing negative pulse erases the internal state every clock cycle, which in turn produces combinational logic behavior.

In general, microwave signals (e.g., SFQ pulses) may be used to control the state of a memory cell. During read/write operations, word-lines and bit-lines may be selectively activated by SFQ pulses arriving via an address bus. These pulses may, in turn, control word-line and bit-line drivers that may provide word-line and bit-line currents to the relevant memory cells. An example memory cell may include two Magnetic Josephson Junction (MJJ) devices and a niobium superconducting quantum interference device (SQUID). A control line may be configured to inductively flip the two MJJ devices in opposite directions—creating one MJJ device with a low current and the other MJJ device having a relatively higher current. This may generate flux bias in one direction. On the other hand, when the control line flips the two MJJ devices in an opposite manner, then this may generate flux bias in the opposite direction. The niobium SQUID may be configured to serve as a sensor of these changes in the flux biases such that one state of the memory cell may be logic "1" state and the other state of the memory cell may be logic "0" state depending upon whether the niobium SQUID generates a voltage pulse or not. The voltage pulse may be sensed by a sense amplifier. The use of the MJJ devices to flux bias the niobium SQUID based on the current direction may advantageously lower the amount of current required to change or sense a state of the memory cell. This is because unlike other memory cells that may use current flow to provide flux biasing, certain examples of the present disclosure provide a solution in which current steering may be used to create the flux biasing. As an example, the MJJ devices may be used to steer current in a clock-wise direction or in an anti-clock-wise direction and thereby provide flux biasing.

In one example, the MJJ device may include at least one fixed magnetic layer and at least one free magnetic layer. In one state, the magnetic polarity associated with the free magnetic layer may be substantially parallel to the magnetic polarity associated with the fixed magnetic layer. This state of the MJJ device may be referred to as the parallel state. In another state, the magnetic polarity associated with the free magnetic layer may be substantially opposite to the magnetic polarity associated with the fixed magnetic layer. This state of the MJJ device may be referred to as the anti-parallel state.

Memory cells may be arranged in rows and columns, such that each row can be activated by a common flux bias (e.g., a read word-line signal) and each bit-line may form a transmission line that may propagate the output of the memory cells in a voltage state to a sense amplifier at one end of the column. Memory cells in a column may be serially biased by a common current source; for example, a flux pump.

FIG. 1 shows a diagram of a memory cell 100 in accordance with one example. In one example, memory cell 100 may include a first magnetic Josephson junction (MJJ) device 105 and a second magnetic Josephson junction (MJJ) device 115 arranged in parallel to each other. MJJ 105 and MJJ 115 may or may not be magnetic. The two MJJs may form a superconducting quantum interference device (SQUID). Memory cell 100 may further include two inductors 116 and 136. In one example, memory cell 100 may further include a Josephson junction (JJ) 120 and a Josephson junction (JJ) 122, arranged in parallel to each other, which may form a niobium-based (or another superconducting metal-based) superconducting quantum interference device (SQUID).

With continued reference to FIG. 1, memory cell 100 may be coupled to word-lines and bit-lines for performing various memory operations, including, for example, read and write operations. As an example, a read word-line (RWL) for performing a read operation may be coupled to memory cell 100 via inductor 116. A write word-line (WWL) for performing a write operation may be coupled to memory cell 100. In addition, a read bit-line (RBL) for performing a read operation may be coupled to memory cell 100 via inductor 136. A write bit-line (WBL) for performing a write operation may also be coupled to memory cell 100. The write bit-line (WBL) may also be used to form a coupling with MJJ device 105, which may alter the magnetic polarity of the free magnetic layer of MJJ device 105. Additionally, as shown in FIG. 1, the write word-line (WWL) may also be used to form a coupling with MJJ device 105, which may alter the magnetic polarity of the free magnetic layer of MJJ device 1105. The WWL may also be used to form a coupling, which may alter the magnetic polarity of the free magnetic layer of MJJ device 115. During a write operation, current may be coupled via WBL to MJJ device 1105 and via WWL to MJJ device 105. Although FIG. 1 shows WBL coupled to MJJ device 105 only, it may be coupled to MJJ device 115 as well.

The write bit-line may be magnetically coupled to MJJ device 105. In one example, coupling with MJJ 105 may be such that a magnetic field generated by at least one of the magnetic barrier layers of MJJ device 105 can be changed by the application of a local read word-line current and by the application of a local bit-line current. In one example, MJJ device 105 may be in a first state (e.g., corresponding to a first configuration of magnetization of the at least one free magnetic layer) and a second state (e.g., corresponding to a second configuration of magnetization of the at least one free magnetic layer), where the first configuration of the magnetization may be substantially different from the second configuration of the magnetization. In one example, MJJ device 105 may be in one state when the magnetic fields generated by the fixed magnetic layer and the free magnetic layer oppose each other.

Still referring to FIG. 1, Icc is a DC bias current, which may be steered based on a state of the SQUID formed by MJJs 105 and 115. When both RBL and WWL are selected, the free magnetic layer of MJJ 105 may change from the anti-parallel magnetization state (high-Ic) to the parallel magnetization state (low-Ic). The DC bias current Icc may be steered to the high-Ic MJJ, which in turn may create a clock-wise current or a counter-clock-wise current depending upon the MJJ SQUID geometry. In this example, the counter-clock-wise current may create a flux bias in the sensing niobium SQUID (formed by JJ 120 and JJ 122 of FIG. 1). This flux bias may be read by sending a flux bias along the RWL and pulsing the RBL. If the flux bias generated by the MJJ and the flux bias along the RWL are in the same direction, then the niobium SQUID will pulse (representing logic state "1"). If, on the other hand, the flux bias generated by the MJJ and flux bias along the RWL are in the opposite direction, then the niobium SQUID will not pulse (representing logic state "0").

Figure 2:
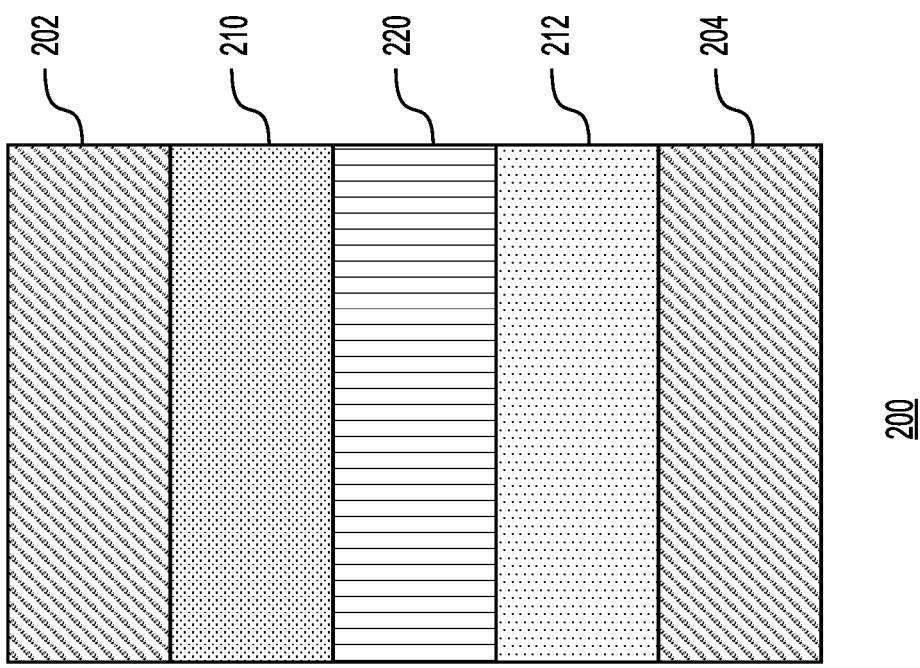
FIG. 2 shows a structure of a Magnetic Josephson Junction (MJJ) device for used with the memory cell of FIG. 1 in accordance with one example.

FIG. 2 shows a magnetic Josephson junction (MJJ) device 200 in accordance with one example. In one example, MJJ device 105 and MJJ device 115 of FIG. 1 may be configured as MJJ device 200. In this example, MJJ device 200 may include a conductive layer 202 and another conductive layer 204. In this example, conductive layer 202 and conductive layer 204 may be formed using niobium or another appropriate superconducting metal. In this example, the thickness of each of these conductive layers may be 100 Angstroms to 2000 Angstroms. MJJ device 200 may further include non-magnetic layer 220, which may be sandwiched between a free magnetic layer 210 and a fixed magnetic layer 212. Thus, in this example, free magnetic layer 210 may be formed above non-magnetic layer 220 and fixed magnetic layer 212 may be formed below non-magnetic layer 220. There could be intervening layers between any of these layers. The terms above and below are merely used to indicate that free magnetic layer 210 is on one side of non-magnetic layer 220 and fixed magnetic layer 212 is formed on the other side of non-magnetic layer 320. These terms do not imply a particular order of creating these layers. In other words, in the context of this disclosure, above may mean below and below may mean above.

In one example, free magnetic layer 210 may have very soft magnetic properties to allow for switching of the magnetization direction in response to small magnetic fields. As an example, at liquid helium temperature, free magnetic layer 210 may have saturation magnetization below 350 emu/cc, a coercivity value of less than 10 Oersted, and an anisotropy field value of less than 20 Oersted. Free magnetic layer 210 may include a first magnetic alloy doped with at least one of Vanadium, Zirconium, Molybdenum, or Hafnium. As an example, free magnetic layer 210 may include doped alloy $V_{20}(Ni_{75}Fe_{25})_{80}$. Thus, free magnetic layer 210 may include a Nickel-Iron (Ni—Fe) alloy doped with Vanadium (V). Vanadium may have a concentration of 20 atomic percent and the Ni—Fe alloy may have a concentration of 80 atomic percent. Within the Ni—Fe alloy, Ni may have a concentration of 75 atomic percent and Fe may have a concentration of 25 atomic percent. In one example, Vanadium may have a concentration in a range between 1-40 atomic percent and the Ni—Fe alloy may have a concentration in a range between 60-99 atomic percent. Within the Ni—Fe alloy, the concentration of Ni may be varied between 75 atomic percent to 95 atomic percent and the concentration of Fe may be varied between 5 atomic percent to 25 atomic percent. In one example, free magnetic layer 210 may be 15 Angstroms in thickness. In this example, fixed magnetic layer 212 may be formed using an un-doped magnetic alloy. In another example, fixed magnetic layer 212 may have a lower amount of doping than free magnetic layer 210. In one example, fixed magnetic layer 212 may have a larger hysteresis than the hysteresis for free magnetic layer 210. Fixed magnetic layer 212 may also have a larger coercivity value ($H_C$) compared to free magnetic layer 210. Fixed magnetic layer 212 may also have a large squareness (remnant magnetization ($M_R$)/saturation magnetization ($M_S$) ratio). The thickness of fixed magnetic layer 212 may be selected to enable the transition of MJJ device between a high current and a low current state. As an example, fixed magnetic layer 212 may include doped alloy $V_{10}(Ni_{80}Fe_{20})_{90}$. Thus, fixed magnetic layer 212 may include a Ni—Fe alloy doped with Vanadium. Vanadium may have a concentration of 10 atomic percent and the Ni—Fe alloy may have a concentration of 90 atomic percent. Within the Ni—Fe alloy, Ni may have a concentration of 80 atomic percent and Fe may have a concentration of 20 atomic percent. In one example, fixed magnetic layer 212 may be 25 Angstroms in thickness. In general, magnetic layers may have a thickness of 10 Angstroms to 25 Angstroms. The magnetic alloy may be a Ni—Co alloy, an Fe—Co alloy, or a Co—Ni—Fe alloy. In another example, magnetic layers may include a Ni—Fe alloy doped with Zirconium (Zr), such as $Zr_z(Ni_{80}Fe_{20})_{1-z}$, where a concentration of Zirconium may be varied in a range between 2 atomic percent to 20 atomic percent. In other examples, magnetic layers may include a Ni—Fe alloy doped with Molybdenum or Hafnium. Non-magnetic layer 220 may include at least one of Vanadium (V), Molybdenum (Mo), Copper (Cu), Aluminum (Al), Tantalum (Ta), or Chromium (Cr). Any of the layers described with respect to FIG. 2 may be formed using physical vapor deposition (PVD) techniques, such as sputtering. Although FIG. 2 shows a certain number of layers of MJJ device 200 arranged in a certain manner, there could be more or fewer layers arranged differently. As an example, each of MJJ device 105 and MJJ device 115 may comprise a first superconducting metal layer, a dielectric layer, an anti-ferromagnetic layer, a conductive metal layer, a ferromagnetic layer, and a second superconducting metal layer.

Figure 3:
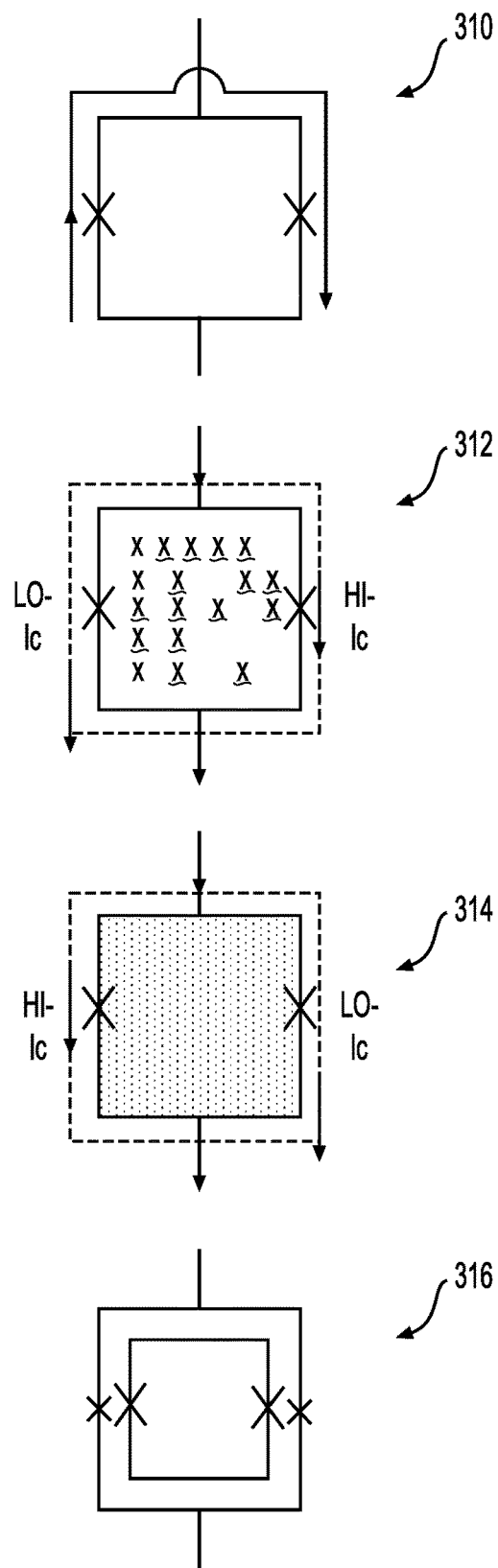
FIG. 3 shows the operation of a memory cell (e.g., memory cell of FIG. 1) in accordance with one example.

FIG. 3 shows a schematic of the operation of a memory cell (e.g., memory cell of 100 FIG. 1) in accordance with one example. As shown at stage 310, using a control line that is inductively coupled to the two MJJ devices, the critical current (Ic) in either of the two MJJ devices can be set to a high Ic value (Hi-Ic) or a low Ic value (Lo-Ic). At stage 312, the two MJJ devices are shown in a first state, where the right MJJ device is set to a high Ic value (Hi-Ic) and the left MJJ device is set to a low Ic value (Lo-Ic). At this stage, the current flowing through the SQUID formed by two MJJ devices will distribute in a manner that it will create a flux into a direction perpendicular to the current flow going inwards towards the center. At stage 314, using the control line, the two MJJ devices are flipped, such that the right MJJ device is set to a low Ic value (Lo-Ic) and the left MJJ device is set to a high Ic value (Hi-Ic). Alternatively, at stage 314, one of the two MJJ devices can be set to a high Ic value (Hi-Ic) or a low Ic value (Lo-Ic) with the other device being unchanged. As a result, the current flowing through the SQUID will create a flux in a direction opposite to the direction in the previous state of the SQUID (e.g., flux will be created in a direction perpendicular to the current flow going outwards out of the center). As shown, at stage 316, the change in the flux is detected by a biased niobium SQUID (shown in the middle). The detection by the niobium SQUID corresponds to whether the flux bias is in one direction or the other. As an example, in one of the directions, the niobium SQUID, when biased correctly, may generate a voltage pulse that can be sensed using a sense amplifier.

With a reference back to FIG. 1, during a write operation, the write word-line (WWL) and the write bit-line (WBL) may receive current from respective drivers. A series of timed write pulses provided via the WWL and the WBL may be used to create magnetic fields at the selected memory cell(s) to set the free magnetization layer. That setting in turn may reflect one of the logic states (high or low) of the memory cell.

Referring again to FIG. 1, during a read operation, the read word-line (RWL) and the read bit-line (RBL) may receive current from the respective drivers (e.g., word-line drivers and bit-line drivers). In one example, read word-line (RWL) may be coupled to inductor 116. In one example, read bit-line (RBL) may be coupled directly to the niobium SQUID and provide a local bit-line current. In one state (e.g., a high Ic value (Hi-Ic) or a low Ic value (Lo-Ic)), MJJ 105 may provide a further flux bias to the niobium SQUID formed by the MJJs. During a read operation, the flux bias from MJJ 105 may add to the flux generated by the current flowing through the local read word-line, causing the niobium SQUID to transition to a voltage state. In a second state (e.g., the zero state), MJJ 105 may provide much less flux bias to the niobium SQUID. The flux generated as a result of the current flowing through the local read word-line may not be enough to drive the niobium SQUID into a voltage state. The change in an output voltage, current, or any other parameter of memory cell 100 may be sensed using a sense amplifier. In one example, the presence or absence of a current pulse, once amplified by the sense amplifier, may determine the state of memory cell 100 as logic '0' or logic '1'. As an example, the logic '1' state may correspond to a "voltage state," in which a sense amplifier coupled to the memory cell may sense the voltage as being representative of the logic '1' state. The logic '0' state may correspond to a "substantially zero-voltage state," such that the sense amplifier may sense this as being representative of the logic '0' state.

Figure 4:
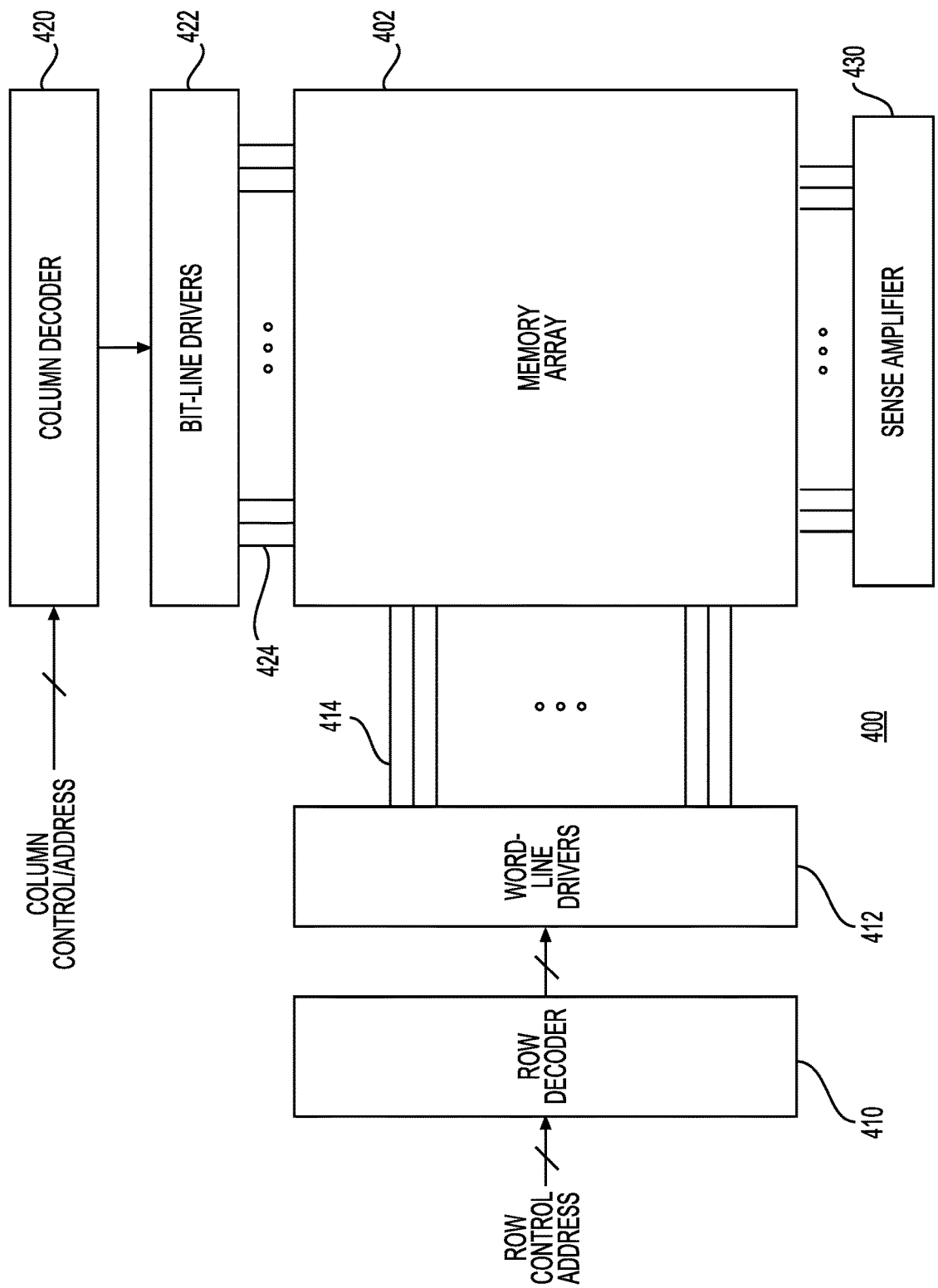
FIG. 4 shows a memory system with the memory cells of FIG. 1 in accordance with one example.

FIG. 4 shows a diagram of a memory system 400 in accordance with one example. Memory system 400 may include an array 402 of memory cells arranged in rows and columns. In one example, array 402 may be an array of memory cells, having the same structure and operation as memory cell 100 of FIG. 1. Memory system 400 may further include a row decoder 410 that may be configured to decode row control/address signals. Row decoder 410 may further be coupled to word-line drivers 412. Word-line drivers 412 may include circuitry to provide word-line read/write current to a subset or all of the memory cells associated with a selected word-line for any read or write operations. Word-line drivers 412 may provide such current via word-lines 414. Word-lines 414 may include both read word-lines and write word-lines. In other words, different word-lines may be used to provide current to the selected memory cells for read or write operations. Memory system 400 may further include column decoder 420 that may be configured to decode column control/address signals. Column decoder 420 may further be coupled to bit-line drivers 422. Bit-line drivers 422 may include circuitry to provide bit-line read current to a subset or all of the memory cells associated with a selected bit-line for any read or write operations. Bit-line drivers 422 may provide such current via bit-lines 424. Bit-lines 424 may include both read bit-lines and write bit-lines. In other words, different bit-lines may be used to provide current to the selected memory cells for read or write operations. By using row and column addresses, any of the memory cells could be accessed using an address. Each of the bit-lines (e.g., bit-lines 424) may further be coupled to sense amplifier 430 for sensing bit-lines to determine the logical state of each of the array 402 of memory cells. The coupling between the array 402 of memory cells and sense amplifier 430 may include radio frequency (RF) transmission lines. The memory cells in each column may be serially current-biased by a common current source (e.g., a flux pump). As described earlier, bit-lines 424 may be used to couple this current to each of the memory cells in a column. Although FIG. 4 shows a certain number of components of memory system 400 arranged in a certain manner, there could be more or fewer number of components arranged differently.

Figure 5:
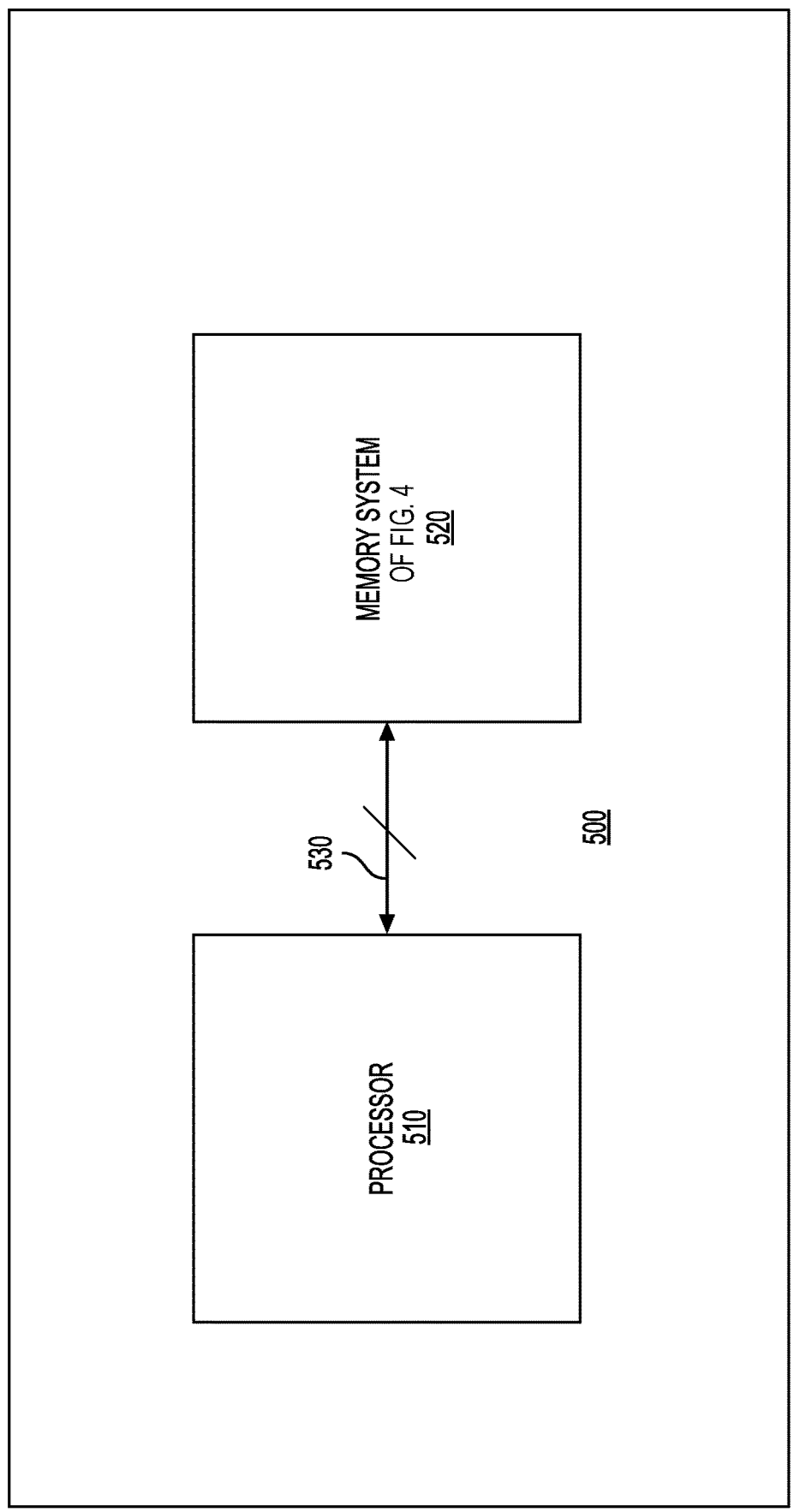
FIG. 5 shows a computing system including a memory, coupled to a processor, in accordance with one example.

FIG. 5 shows a computing system 500 including a processor 510 coupled to a memory 520 (e.g., memory system 400 of FIG. 4) via a bus 530 in accordance with one example. Processor 510 may perform read or write operations on memory 520 in a manner as explained earlier.

Additionally, processor 510 and memory 520 may be used along with other superconducting logic-based devices. In general, any superconducting device operating in cryogenic environments and requiring storage of instructions or data may include memory 520. Furthermore, processor 510 need not be in a cryogenic environment; instead, it may operate at non-cryogenic temperatures. In this example, memory 520 may be in a separate cryogenic environment and may be coupled via connectors to processor 510 in a way that the cryogenic environment can be maintained. Memory 520 may be used as part of storage in a data center for delivering cloud-based services, such as software as a service, platform as a service, or other services.

In conclusion, the present disclosure relates to in one example, the present disclosure relates to a memory cell including a magnetic Josephson junction (MJJ) superconducting quantum interference device (SQUID) comprising a first MJJ device and a second MJJ device, arranged in parallel to each other, where the MJJ SQUID is configured to generate a first flux-bias or a second flux-bias, where the first flux-bias corresponds to a first direction of current flow in the MJJ SQUID and the second flux-bias corresponds to a second direction of current flow in the MJJ SQUID, where the first direction is opposite to the second direction. The memory cell may further include a superconducting metal-based superconducting quantum interference device (SQUID) including a first Josephson junction (JJ) and a second JJ, arranged in parallel to each other, where each of the first JJ and the second JJ has a critical current responsive to any flux-bias generated by the MJJ SQUID, and where in response to a read operation, the superconducting metal-based SQUID is configured to provide an output based at least on the first flux-bias or the second flux-bias.

In the memory cell, the first flux-bias may correspond to a first logic state of the memory cell and the second flux-bias may correspond to a second logic state of the memory cell, where the second logic state is opposite to the first logic state. The output may comprise a voltage pulse when a logic state of the memory cell is the first logic state and where the output comprises no voltage pulse when a logic state of the memory cell is the second logic state.

In the memory cell, each of the first MJJ device and the second MJJ device may comprise a first layer formed above a second layer and a third layer formed below the second layer, where the first layer is a free magnetic layer, the second layer is a non-magnetic layer, and where the third layer is a fixed magnetic layer. The first logic state may correspond to a first configuration of magnetization of the free magnetic layer and the second logic state may correspond to a second configuration of magnetization of the free magnetic layer, where the first configuration of the magnetization of the free magnetic layer corresponds to a first magnetic field that is parallel to a magnetic field of the fixed magnetic layer and the second configuration of the magnetization of the free magnetic layer corresponds to a second magnetic field that is anti-parallel to the magnetic field of the fixed magnetic layer. Each of the first MJJ device and the second MJJ device may comprise a first superconducting metal layer, a dielectric layer, an anti-ferromagnetic layer, a conductive metal layer, a ferromagnetic layer, and a second superconducting metal layer. Each of the first MJJ device and the second MJJ device may be configured for single-domain switching.

In another aspect, the present disclosure relates to a method in a memory cell including a magnetic Josephson junction (MJJ) superconducting quantum interference device (SQUID) comprising a first MJJ device and a second MJJ device, arranged in parallel to each other, and a superconducting metal-based superconducting quantum interference device (SQUID) including a first Josephson junction (JJ) and a second JJ, arranged in parallel to each other. The method may include generating a first flux-bias or a second flux-bias, where the first flux-bias corresponds to a first direction of current flow in the MJJ SQUID and the second flux-bias corresponds to a second direction of current flow in the MJJ SQUID, where the first direction is opposite to the second direction. The method may further include in response to a read operation, responsive to any flux-bias generated by the MJJ SQUID, the superconducting metal-based SQUID providing an output based at least on the first flux-bias or the second flux-bias.

The first flux-bias may correspond to a first logic state of the memory cell and the second flux-bias may correspond to a second logic state of the memory cell, where the second logic state is opposite to the first logic state. The output may comprise a voltage pulse when a logic state of the memory cell is the first logic state and where the output comprises no voltage pulse when a logic state of the memory cell is the second logic state.

In the memory cell, each of the first MJJ device and the second MJJ device may comprise a first layer formed above a second layer and a third layer formed below the second layer, where the first layer is a free magnetic layer, the second layer is a non-magnetic layer, and where the third layer is a fixed magnetic layer. The first logic state may correspond to a first configuration of magnetization of the free magnetic layer and the second logic state may correspond to a second configuration of magnetization of the free magnetic layer, where the first configuration of the magnetization of the free magnetic layer corresponds to a first magnetic field that is parallel to a magnetic field of the fixed magnetic layer and the second configuration of the magnetization of the free magnetic layer corresponds to a second magnetic field that is anti-parallel to the magnetic field of the fixed magnetic layer. Each of the first MJJ device and the second MJJ device may comprise a first superconducting metal layer, a dielectric layer, an anti-ferromagnetic layer, a conductive metal layer, a ferromagnetic layer, and a second superconducting metal layer. Each of the first MJJ device and the second MJJ device may be configured for single-domain switching.

In yet another aspect, the present disclosure relates to a memory system including an array of memory cells arranged in rows and columns, a set of read word-lines coupled to the array of the memory cells, and a set of read bit-lines coupled to the array of memory cells. Each of the memory cells may include a magnetic Josephson junction (MJJ) superconducting quantum interference device (SQUID) comprising a first MJJ device and a second MJJ device, arranged in parallel to each other, where the MJJ SQUID is configured to generate a first flux-bias or a second flux-bias, where the first flux-bias corresponds to a first direction of current flow in the MJJ SQUID and the second flux-bias corresponds to a second direction of current flow in the MJJ SQUID, where the first direction is opposite to the second direction. Each of the memory cells may further include a superconducting metal-based superconducting quantum interference device (SQUID) including a first Josephson junction (JJ) and a second JJ, arranged in parallel to each other, where each of the first JJ and the second JJ has a critical current responsive to any flux-bias generated by the MJJ SQUID, and where, in response to a read operation initiated via at least one of set of the read word-lines and at least one of the set of the read-bit lines, the superconducting metal-based SQUID is configured to provide an output based at least on the first flux-bias or the second flux-bias.

In the memory cell, the first flux-bias may correspond to a first logic state of the memory cell and the second flux-bias may correspond to a second logic state of the memory cell, where the second logic state is opposite to the first logic state. The output may comprise a voltage pulse when a logic state of the memory cell is the first logic state and where the output comprises no voltage pulse when a logic state of the memory cell is the second logic state.

In the memory cell, each of the first MJJ device and the second MJJ device may comprise a first layer formed above a second layer and a third layer formed below the second layer, where the first layer is a free magnetic layer, the second layer is a non-magnetic layer, and where the third layer is a fixed magnetic layer. The first logic state may correspond to a first configuration of magnetization of the free magnetic layer and the second logic state may correspond to a second configuration of magnetization of the free magnetic layer, where the first configuration of the magnetization of the free magnetic layer corresponds to a first magnetic field that is parallel to a magnetic field of the fixed magnetic layer and the second configuration of the magnetization of the free magnetic layer corresponds to a second magnetic field that is anti-parallel to the magnetic field of the fixed magnetic layer. Each of the first MJJ device and the second MJJ device may comprise a first superconducting metal layer, a dielectric layer, an anti-ferromagnetic layer, a conductive metal layer, a ferromagnetic layer, and a second superconducting metal layer.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine, such as processor 510, to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A memory cell comprising:
   a magnetic Josephson junction (MJJ) superconducting quantum interference device (SQUID) comprising a first MJJ device and a second MJJ device, arranged in parallel to each other, wherein the MJJ SQUID is configured to generate a first flux-bias or a second flux-bias, wherein the first flux-bias corresponds to a first direction of current flow in the MJJ SQUID and the second flux-bias corresponds to a second direction of current flow in the MJJ SQUID, wherein the first direction is opposite to the second direction; and
   a superconducting metal-based superconducting quantum interference device (SQUID) including a first Josephson junction (JJ) and a second JJ, arranged in parallel to each other, wherein each of the first JJ and the second JJ has a critical current responsive to any flux-bias generated by the MJJ SQUID, and wherein in response to a read operation, the superconducting metal-based SQUID is configured to provide an output based at least on the first flux-bias or the second flux-bias.

2. The memory cell of claim 1, wherein the first flux-bias corresponds to a first logic state of the memory cell and the second flux-bias corresponds to a second logic state of the memory cell, wherein the second logic state is opposite to the first logic state.

3. The memory cell of claim 2, wherein the output comprises a voltage pulse when a logic state of the memory cell is the first logic state and wherein the output comprises no voltage pulse when a logic state of the memory cell is the second logic state.

4. The memory cell of claim 2, wherein each of the first MJJ device and the second MJJ device comprises a first layer formed above a second layer and a third layer formed below the second layer, wherein the first layer is a free magnetic layer, the second layer is a non-magnetic layer, and wherein the third layer is a fixed magnetic layer.

5. The memory cell of claim 4, wherein the first logic state corresponds to a first configuration of magnetization of the free magnetic layer and the second logic state corresponds to a second configuration of magnetization of the free magnetic layer, wherein the first configuration of the magnetization of the free magnetic layer corresponds to a first magnetic field that is parallel to a magnetic field of the fixed magnetic layer and the second configuration of the magnetization of the free magnetic layer corresponds to a second magnetic field that is anti-parallel to the magnetic field of the fixed magnetic layer.

6. The memory cell of claim 1, wherein each of the first MJJ device and the second MJJ device comprises a first superconducting metal layer, a dielectric layer, an anti-ferromagnetic layer, a conductive metal layer, a ferromagnetic layer, and a second superconducting metal layer.

7. The memory cell of claim 1, wherein each of the first MJJ device and the second MJJ device is configured for single-domain switching.

8. A method in a memory cell including a magnetic Josephson junction (MJJ) superconducting quantum interference device (SQUID) comprising a first MJJ device and a second MJJ device, arranged in parallel to each other, and a superconducting metal-based superconducting quantum interference device (SQUID) including a first Josephson junction (JJ) and a second JJ, arranged in parallel to each other, the method comprising:
generating a first flux-bias or a second flux-bias, wherein the first flux-bias corresponds to a first direction of current flow in the MJJ SQUID and the second flux-bias corresponds to a second direction of current flow in the MJJ SQUID, wherein the first direction is opposite to the second direction; and
in response to a read operation, responsive to any flux-bias generated by the MJJ SQUID, the superconducting metal-based SQUID providing an output based at least on the first flux-bias or the second flux-bias.

9. The method of claim 8, wherein the first flux-bias corresponds to a first logic state of the memory cell and the second flux-bias corresponds to a second logic state of the memory cell, wherein the second logic state is opposite to the first logic state.

10. The method of claim 9, wherein the output comprises a voltage pulse when a logic state of the memory cell is the first logic state and wherein the output comprises no voltage pulse when a logic state of the memory cell is the second logic state.

11. The method of claim 9, wherein each of the first MJJ device and the second MJJ device comprises a first layer formed above a second layer and a third layer formed below the second layer, wherein the first layer is a free magnetic layer, the second layer is a non-magnetic layer, and wherein the third layer is a fixed magnetic layer.

12. The method of claim 11, wherein the first logic state corresponds to a first configuration of magnetization of the free magnetic layer and the second logic state corresponds to a second configuration of magnetization of the free magnetic layer, wherein the first configuration of the magnetization of the free magnetic layer corresponds to a first magnetic field that is parallel to a magnetic field of the fixed magnetic layer and the second configuration of the magnetization of the free magnetic layer corresponds to a second magnetic field that is anti-parallel to the magnetic field of the fixed magnetic layer.

13. The method of claim 8, wherein each of the first MJJ device and the second MJJ device comprises a first superconducting metal layer, a dielectric layer, an anti-ferromagnetic layer, a conductive metal layer, a ferromagnetic layer, and a second superconducting metal layer.

14. The method of claim 8, wherein each of the first MJJ device and the second MJJ device is configured for single-domain switching.

15. A memory system comprising:
an array of memory cells arranged in rows and columns;
a set of read word-lines coupled to the array of the memory cells;
a set of read bit-lines coupled to the array of memory cells, and wherein each of the memory cells comprises:
a magnetic Josephson junction (MJJ) superconducting quantum interference device (SQUID) comprising a first MJJ device and a second MJJ device, arranged in parallel to each other, wherein the MJJ SQUID is configured to generate a first flux-bias or a second flux-bias, wherein the first flux-bias corresponds to a first direction of current flow in the MJJ SQUID and the second flux-bias corresponds to a second direction of current flow in the MJJ SQUID, wherein the first direction is opposite to the second direction; and
a superconducting metal-based superconducting quantum interference device (SQUID) including a first Josephson junction (JJ) and a second JJ, arranged in parallel to each other, wherein each of the first JJ and the second JJ has a critical current responsive to any flux-bias generated by the MJJ SQUID, and wherein in response to a read operation initiated via at least one of set of the read word-lines and at least one of the set of the read-bit lines, the superconducting metal-based SQUID is configured to provide an output based at least on the first flux-bias or the second flux-bias.

16. The memory system of claim 15, wherein the first flux-bias corresponds to a first logic state of the memory cell and the second flux-bias corresponds to a second logic state of the memory cell, and wherein the second logic state is opposite to the first logic state.

17. The memory system of claim 16, wherein the output comprises a voltage pulse when a logic state of the memory cell is the first logic state and wherein the output comprises no voltage pulse when a logic state of the memory cell is the second logic state.

18. The memory system of claim 16, wherein each of the first MJJ device and the second MJJ device comprises a first layer formed above a second layer and a third layer formed below the second layer, wherein the first layer is a free magnetic layer, the second layer is a non-magnetic layer, and wherein the third layer is a fixed magnetic layer.

19. The memory system of claim 18, wherein the first logic state corresponds to a first configuration of magnetization of the free magnetic layer and the second logic state corresponds to a second configuration of magnetization of the free magnetic layer, wherein the first configuration of the magnetization of the free magnetic layer corresponds to a first magnetic field that is parallel to a magnetic field of the fixed magnetic layer and the second configuration of the magnetization of the free magnetic layer corresponds to a second magnetic field that is anti-parallel to the magnetic field of the fixed magnetic layer.

20. The memory system of claim 15, wherein each of the first MJJ device and the second MJJ device comprises a first superconducting metal layer, a dielectric layer, an anti-ferromagnetic layer, a conductive metal layer, a ferromagnetic layer, and a second superconducting metal layer.

* * * * *